United States Patent
Hynecek

[19]

[11] Patent Number: 5,837,563
[45] Date of Patent: Nov. 17, 1998

[54] SELF ALIGNED BARRIER PROCESS FOR SMALL PIXEL VIRTUAL PHASE CHARGED COUPLED DEVICES

[75] Inventor: Jaroslav Hynecek, Richardson, Tex.

[73] Assignee: Texas Instruments Incorporated, Dallas, Tex.

[21] Appl. No.: 703,262

[22] Filed: Aug. 26, 1996

[51] Int. Cl.[6] .................................................. H01L 21/339
[52] U.S. Cl. .......................... 438/60; 438/234; 438/75; 438/76
[58] Field of Search .................. 438/234, 60, 75, 438/76, 146; 257/246, 217

[56] References Cited

U.S. PATENT DOCUMENTS

| 4,229,752 | 10/1980 | Hynecek | 357/24 |
|---|---|---|---|
| 4,613,402 | 9/1986 | Losee et al. | 438/146 |
| 4,992,392 | 2/1991 | Nichols et al. | 438/175 |
| 5,151,380 | 9/1992 | Hynecek | 437/53 |
| 5,516,716 | 5/1996 | Hawkins et al. | 438/144 |
| 5,641,700 | 6/1997 | Hawkins et al. | 257/246 |

*Primary Examiner*—Charles L. Bowers, Jr.
*Assistant Examiner*—Craig Thompson
*Attorney, Agent, or Firm*—Alan K. Stewart; Jay C. Cantor; Richard L. Donaldson

[57] ABSTRACT

The method for making a charge coupled device includes: forming a semiconductor region 24 of a first conductivity type; forming gate regions 28 and 30 overlying and separated from the semiconductor region 24; forming clocked barrier implants 36 and 38 of a second conductivity type in the semiconductor region 24 and aligned to the gate regions 36 and 38; depositing a semiconductor layer 70 overlying and separated from the semiconductor region 24 and the gate regions 28 and 30; removing a portion of the semiconductor layer 70 leaving semiconductor side walls 40 and 42 coupled to the gate regions 28 and 30.

20 Claims, 2 Drawing Sheets

SELF ALIGNED BARRIER PROCESS FOR SMALL PIXEL VIRTUAL PHASE CHARGED COUPLED DEVICES

FIELD OF THE INVENTION

This invention generally relates to charge coupled devices, and more particularly relates to virtual phase charge coupled devices.

BACKGROUND OF THE INVENTION

Prior art virtual phase CCD processes are only partially self-aligned. The clocked barrier as well as the virtual barrier are defined by separate masks. This presents a problem of alignment accuracy when the pixel size is reduced. Only the virtual gate P+ region is self aligned to the polysilicon and the virtual well implant is self aligned only at one edge. Both barriers, clocked and virtual are defined by a masking process which has a tolerance limit. This limit becomes a problem when the barriers have submicron dimensions which are necessary for small pixel CCD image sensors. Another problem in the prior art occurs in the virtual barrier region. There is an overlap of the clocked well "As" implant which is compensated by the P+ boron implant to obtain a self aligned edge of the clocked well to the virtual barrier. However, the compensation is not perfect which causes a small retrograde well (parasitic well) in the barrier region. This in turn causes difficulty for charge transfer efficiency, since a small amount of charge can be trapped in this well.

SUMMARY OF THE INVENTION

Generally, and in one form of the invention, a method for making a charge coupled device includes: forming a semiconductor region of a first conductivity type; forming gate regions overlying and separated from the semiconductor region; forming clocked barrier implants of a second conductivity type in the semiconductor region and aligned to the gate regions; depositing a semiconductor layer overlying and separated from the semiconductor region and the gate regions; removing a portion of the semiconductor layer leaving side walls coupled to the gate regions.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
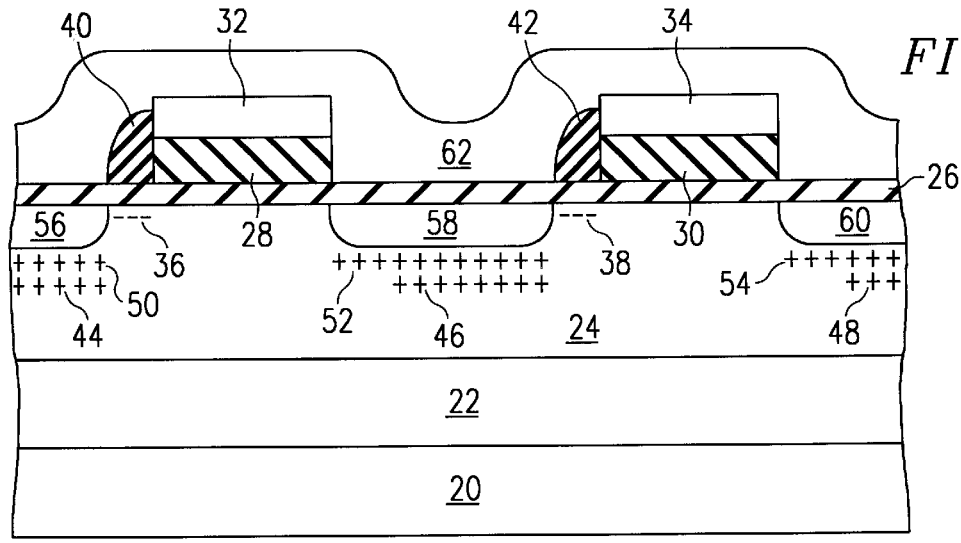
FIG. 1 is a cross-section of a first preferred embodiment self aligned charge coupled device structure.

FIG. 1 is a cross-section of a first preferred embodiment self aligned virtual phase charge coupled device (CCD) structure. The structure of FIG. 1 includes a P+ type semiconductor substrate 20, P– semiconductor layer 22, N type semiconductor region (buried channel) 24, insulator layer (oxide) 26, patterned gate regions (polysilicon) 28 and 30, insulator regions (oxide) 32 and 34, clocked barrier implants 36 and 38, gate side wall regions (polysilicon) 40 and 42, virtual well donor implants 44, 46, and 48, virtual barrier donor implants 50, 52, and 54, P+ virtual gates 56, 58, and 60, and insulator layer (oxide) 62.

Figure 2:
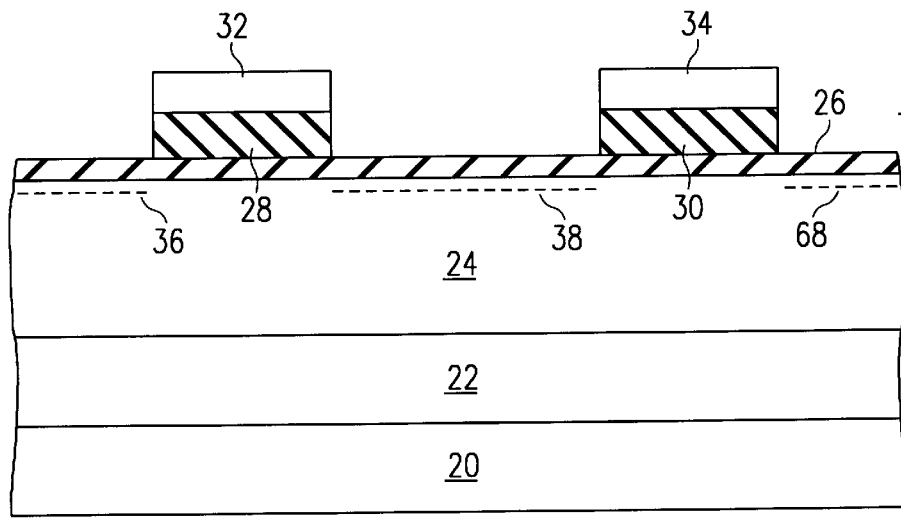
FIGS. 2–5 show the device of FIG. 1 at four stages of fabrication.

FIGS. 2–5 illustrate successive steps in a process for fabricating the virtual phase CCD according to the preferred embodiment, as shown in FIG. 1. Referring first to FIG. 2, the process begins with a silicon substrate 20 of P+ type conductivity.

Then a P– epitaxial layer 22 is formed over the substrate. Next an N type buried channel region 24 is formed by N type doping. Gate oxide layer 26 is then grown by oxidation to the desired thickness, for example, about 1000 angstroms. Next, a layer of polysilicon is deposited over the oxide and doped to be conductive. For the polysilicon layer, from 500 to 5000 Angstroms of polysilicon is deposited. The polysilicon layer may be doped in place by a dopant such as phosphoric oxytrichloride ($POCl_3$). A layer of oxide is then formed over the polysilicon layer. The oxide layer and polysilicon layer are patterned and etched to form patterned gate regions 28 and 30, and oxide regions 32 and 34. Clocked barrier implants 36, 38, and 68 are then formed by an implantation of acceptor impurities such as boron at a zero degree angle.

Figure 3:
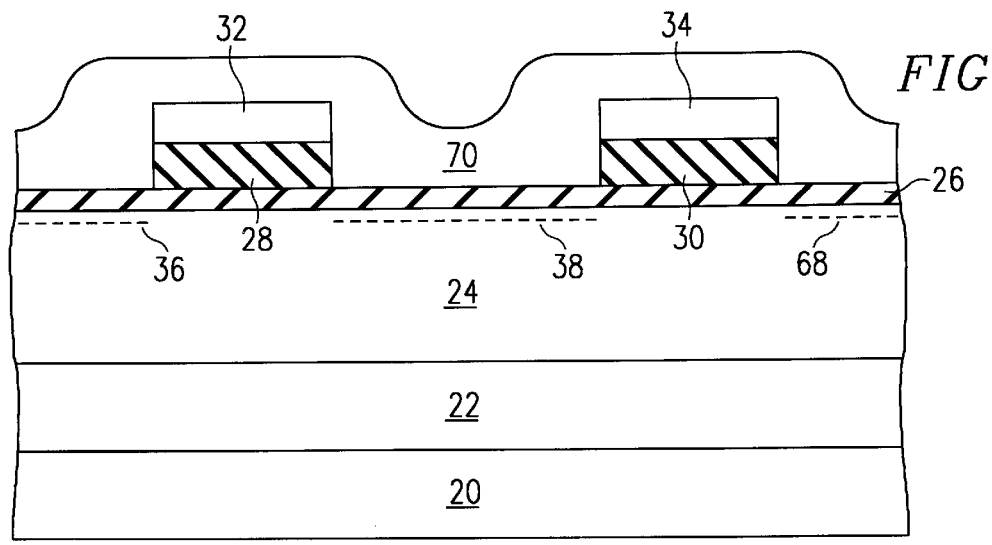
Figure 4:
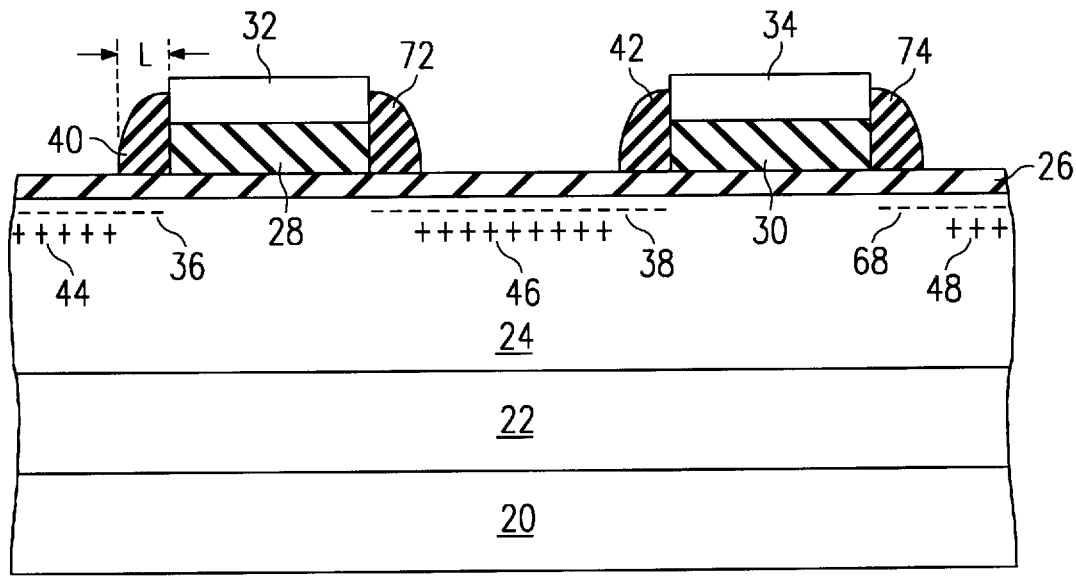

Then another layer of polysilicon 70, shown in FIG. 3, is deposited and etched back to form polysilicon side walls 40, 42, 72, and 74 as shown in FIG. 4. An anisotropic etch is used to form side walls 40, 42, 72, and 74. The length L of the clocked barrier region is defined by the thickness of the side walls 40 and 42. For the preferred embodiment, the length L of the clocked barrier region is approximately 0.5 microns. This dimension is controlled by the thickness of polysilicon layer 70 and by the etch back process.

Figure 5:
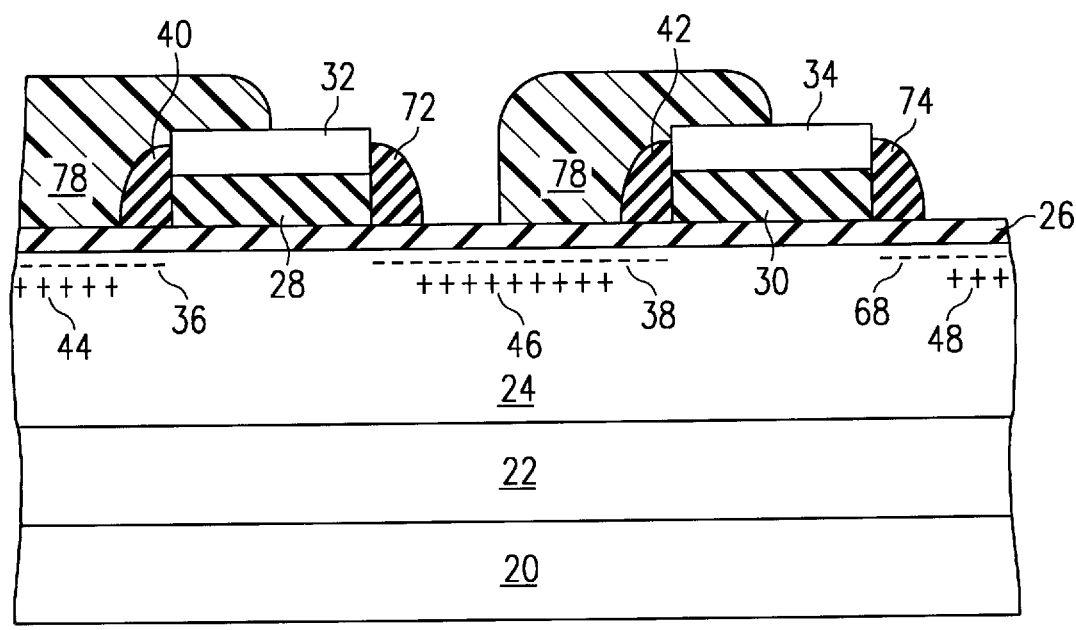

Next, the virtual well donor implants 44, 46, and 48 are formed. A dopant such as phosphorus is used to form donor implants 44, 46, and 48. Donor implants 44, 46, and 48 are self aligned to side walls 40, 42, 72, and 74. Then a photoresist 78 is patterned, as shown in FIG. 5, and the side walls 72 and 74 are etched off. After the photoresist 78 is removed, the virtual barrier donor implants 50, 52, and 54 are formed, as shown in FIG. 1. A dopant such as phosphorus is implanted at a zero degree angle to form donor implants 50, 52, and 54. Then the virtual gates 56, 58, and 60, shown in FIG. 1, are implanted. A dopant such as boron is implanted at a zero degree angle to form the virtual gates 56, 58, and 60. This implantation is followed by heat treatment to anneal the implant damage and to activate the implanted impurities. An oxide overcoat layer 62 is then applied to complete the device shown in FIG. 1.

An advantage of the preferred embodiment is that the clocked barriers and virtual barriers are not defined by masks. They are self aligned and are controlled by processing.

A preferred embodiment has been described in detail hereinabove. It is to be understood that the scope of the invention also comprehends embodiments different from those described, yet within the scope of the claims.

The preferred embodiment is useful for implementation in devices such as CCD imagers, analog processors, memories, linear shift registers, and memory systems.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for making a virtual phase charge coupled device comprising:

forming a semiconductor region of a first conductivity type;

forming gate regions overlying and separated from the semiconductor region;

forming clocked barrier implants of a second conductivity type in the semiconductor region and aligned to the gate regions;

depositing a semiconductor layer overlying and separated from the semiconductor region and the gate regions;

removing a portion of the semiconductor layer leaving first semiconductor side walls coupled to first edges of the gate regions and second semiconductor side walls coupled to second edges of the gate regions;

forming virtual well implants in the semiconductor region aligned to the first and second side walls;

removing the second side walls; and forming virtual gates of a second conductivity type in the semiconductor region aligned to the first side walls and the second edges of the gate regions.

2. The method of claim 1 further comprising, before forming the gate regions, forming a gate insulator layer over the semiconductor region.

3. The method of claim 1 further comprising, before forming the clocked barrier implants, forming insulator regions over the gate regions.

4. The method of claim 1 further comprising, forming an overcoat insulator layer over the semiconductor region and gate regions.

5. The method of claim 1 wherein the first conductivity type is N type.

6. The method of claim 1 wherein the second conductivity type is P type.

7. The method of claim 1 wherein the gate regions are polysilicon.

8. The method of claim 1 wherein the side walls are polysilicon.

9. The method of claim 2 wherein the gate insulator layer is oxide.

10. The method of claim 3 wherein the insulator regions are oxide.

11. The method of claim 4 wherein the overcoat insulator layer is oxide.

12. The method of claim 1 wherein the semiconductor region is formed in a semiconductor layer of the second conductivity type.

13. The method of claim 12 wherein the semiconductor layer overlies a semiconductor substrate of the second conductivity type, the semiconductor substrate has a higher doping concentration than the semiconductor layer.

14. The method of claim 1 further comprising, before forming the virtual gates, forming virtual barrier implants in the semiconductor region aligned to the first side walls and the second edges of the gate regions.

15. A method for making a virtual phase charge coupled device comprising:

forming a semiconductor region of a first conductivity type;

forming gate regions overlying and separated from the semiconductor region;

implanting clocked barrier implants of a second conductivity type in the semiconductor region and aligned to the gate regions;

depositing a semiconductor layer overlying and separated from the semiconductor region and the gate regions;

etching a portion of the semiconductor layer leaving first semiconductor side walls coupled to first edges of the gate regions and second semiconductor side walls coupled to second edges of the gate regions;

implanting virtual well implants in the semiconductor region aligned to the first and second side walls;

removing the second side walls;

implanting virtual barrier implants in the semiconductor region aligned to the first side walls and the second edges of the gate regions; and forming a virtual gate of a second conductivity type in the semiconductor region aligned to the first side walls and the second edges of the gate regions.

16. The method of claim 15 further comprising, before forming the gate regions, forming a gate insulator layer over the semiconductor region.

17. The method of claim 15 wherein the sidewalls are conductive.

18. The method of claim 15 wherein the first conductivity type is N type and the second conductivity type is P type.

19. The method of claim 15 wherein the gate regions are polysilicon.

20. The method of claim 15 wherein the side walls are polysilicon.

* * * * *